(12) United States Patent
Smith

(10) Patent No.: US 9,081,029 B2
(45) Date of Patent: Jul. 14, 2015

(54) APPARATUS FOR MECHANICALLY ROBUST THERMAL ISOLATION OF COMPONENTS

(75) Inventor: Doran Smith, Rockville, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 13/361,145

(22) Filed: Jan. 30, 2012

(65) Prior Publication Data

US 2013/0198913 A1    Aug. 1, 2013

(51) Int. Cl.
| | |
|---|---|
| *G01Q 60/52* | (2010.01) |
| *G01R 33/30* | (2006.01) |
| *G01Q 30/10* | (2010.01) |
| *B82Y 25/00* | (2011.01) |
| *B82Y 35/00* | (2011.01) |
| *G01R 33/32* | (2006.01) |

(52) U.S. Cl.
CPC .............. *G01Q 30/10* (2013.01); *G01Q 60/52* (2013.01); *G01R 33/30* (2013.01); *B82Y 25/00* (2013.01); *B82Y 35/00* (2013.01); *G01R 33/323* (2013.01)

(58) Field of Classification Search
CPC ............ G01L 1/26; G01L 1/242; G01N 3/04; G01N 3/068; G01N 2203/0429; G01N 2203/0226; G01N 2203/0423; G06F 1/203
USPC ............................................. 850/46; 174/156
See application file for complete search history.

(56) References Cited

U.S. PATENT DOCUMENTS

| | | | | |
|---|---|---|---|---|
| 3,189,672 | A * | 6/1965 | Lyman, Jr. ................. | 264/249 |
| 3,218,101 | A * | 11/1965 | Adams ....................... | 296/35.1 |
| 3,519,733 | A * | 7/1970 | Netzel et al. ................. | 174/171 |
| 4,281,213 | A * | 7/1981 | Sciscione .................... | 174/68.2 |
| 4,429,403 | A * | 1/1984 | Hooper ........................ | 373/128 |
| 4,838,033 | A * | 6/1989 | Yamamoto et al. ........... | 62/45.1 |
| 4,843,888 | A * | 7/1989 | Gram et al. ................... | 73/856 |
| 5,295,671 | A * | 3/1994 | Nakagaki et al. ......... | 267/140.13 |
| 5,415,510 | A * | 5/1995 | Funaki et al. ................. | 411/384 |
| 5,749,548 | A * | 5/1998 | Tamura et al. ................. | 248/49 |
| 5,904,870 | A * | 5/1999 | Fenner et al. ................. | 219/201 |
| 6,186,485 | B1 * | 2/2001 | Kawazoe ................. | 267/140.14 |

(Continued)

OTHER PUBLICATIONS

"An Optimal, Magnetic Tip Configuration for Magnetic-Resonance Force Microscopy of Microscale Buried Features", John A. Marohn and Raul Fainchtein, John Hopkins University, Applied Physics Laboratory, Laurel MD, and Doran D. Smith. U.S. Army Research Laboratories. Adelphia, MD, vol. 73, No. 25, Dec. 21, 1998, pp. 3778-3780.

(Continued)

*Primary Examiner* — Phillip A Johnston
*Assistant Examiner* — Sean Luck
(74) *Attorney, Agent, or Firm* — Alan I. Kalb

(57) ABSTRACT

An apparatus for scanning over a surface of an arbitrarily sized sample in magnetic resonance force microscopy comprising a cantilever for holding a magnetic particle at the cantilever tip, an RF antenna, positioned around the cantilever, for emitting an RF magnetic field across a portion of the sample causing spin of particles in the sample to reverse attracting and opposing the magnetic particle at the cantilever tip, an optical fiber, positioned close to the cantilever tip, for measuring displacements of the cantilever tip where the RF antenna, cantilever, magnetic particle and optical fiber are in fixed positions relative to each other and the sample is positionable according to a sample stage.

10 Claims, 3 Drawing Sheets

(56) References Cited

U.S. PATENT DOCUMENTS

| | | | | |
|---|---|---|---|---|
| 6,976,862 | B1* | 12/2005 | Ormazabal Ocerin | 439/246 |
| 2004/0011990 | A1* | 1/2004 | Dunaway et al. | 252/62 |
| 2005/0011574 | A1* | 1/2005 | Watanabe et al. | 138/149 |
| 2009/0242880 | A1* | 10/2009 | Chen | 257/42 |
| 2010/0246134 | A1* | 9/2010 | Hsiao et al. | 361/707 |
| 2010/0319462 | A1* | 12/2010 | Muskopf | 73/856 |
| 2011/0170376 | A1* | 7/2011 | Pike et al. | 367/181 |

OTHER PUBLICATIONS

"Detailed Description of a Compact Cryogenic Magnetic Resonance Force Microscope", Doran D. Smith and John A. Marohn, U.S. Army Research Laboratory, Adelphi, MD and Center for Superconductivity Research, Department of Physics, University of Maryland, College Park, MD, and Lee E. Harrell. Department of Physics, United States Military Academy, West Point, NY, vol. 72, No. 4 Apr. 2001, pp. 2080-2089.

"Miliikelvin Thermal Conductance Measurements of Compact Rigid Thermal Isolation Joints Using Sapphire-Saphire Contacts, and of Coper and Beryllium-Copper Demountable Thermal Contacts", Dan Bintley, Adam Woodcraft and Fred Gannaway, Cardiff School of physics and Astronomy, Cardiff University, UK, Jul 20, 2007, 9 pages.

"Thermal Design of the SCUBA-2 Instrument Detector State and Enclosure", Adam Woodcraft, Fred Gannaway, David Gostick and Dan Bintley, School of Physics and Astronomy, University of Wales, Cardiff, UK, UK Asronomy Technology Centre,Royal Observatory, Edinburgh, UK, 9 pages, no date.

\* cited by examiner

APPARATUS FOR MECHANICALLY ROBUST THERMAL ISOLATION OF COMPONENTS

GOVERNMENT INTEREST

The invention described herein may be manufactured, used and licensed by or for the U.S. Government.

FIELD OF INVENTION

Embodiments of the present invention generally relate to magnetic imaging and, more particularly, to an apparatus for mechanically robust thermal isolation of components in an imaging device.

BACKGROUND OF THE INVENTION

Magnetic resonance force microscopy (MRFM) is an imaging technique that acquires magnetic resonance images (MRI) at nanometer scales, and possibly at atomic scales in the future. An MRFM system comprises a probe, method of applying a background magnetic field, electronics, and optics. The system measures variations in a resonant frequency of a cantilever or variations in the amplitude of an oscillating cantilever. The changes in the characteristic of the cantilever being monitored are indicative of the tomography of the sample. More specifically, as depicted in FIG. 1, an MRFM probe 100 comprises a base 102 with a cantilever 104 tipped with a magnetic (for example, Samarium Cobalt) particle 106 to resonate as the spin of the electrons or nuclei in the sample 101 are reversed. There is a background magnetic field 108 generated by a background magnetic field generator 110 which creates a uniform background magnetic field in the sample 101. As the magnetic tip 106 moves close to the sample 101, the atoms' electrons or nuclear spins become attracted (force detection) to the tip and generate a small force on the cantilever 104. Using a radio frequency (RF) magnetic field applied by an RF antenna 117 through the RF source 105, the spins are then repeatedly flipped at the cantilever's resonant frequency, causing the cantilever 104 to oscillate at its resonant frequency. In the geometry shown, when the cantilever 104 oscillates, the magnetic particle's 106 magnetic moment remains parallel to the background magnetic field 108, and thus it experiences no torque. The displacement of the cantilever is measured with an optical sensor 114 comprised of an interferometer (laser beam) 116 and an optical fiber 118 to create a series of 2-D images of the sample 101 held by sample stage 120, which are combined to generate a 3-D image. The interferometer measures the time dependent displacement of the cantilever 104. Smaller magnetic particles and softer cantilevers increase the signal to noise ratio of the sensor.

Nano-MRI and nano NMR spectroscopy are both performed at a temperature of 4 Kelvin, or colder, to improve signal-to-noise ratio (SNR) over room temperature. The large RF magnetic fields required frequently come with large amounts of heat (1 Watt) that must be conducted out of the base 102 without heating the rest of the apparatus 100. At 4 K, 1 Watt is a large amount of heat for these small probes, typically only 5 to 10 cm in diameter, that often heat the rest of the probe 100 reducing the signal to noise ratio.

Therefore, there is a need in the art for an apparatus mechanically robust thermal isolation of components in an imaging device preventing other probe components from overheating and reducing the signal to noise ratio.

BRIEF SUMMARY OF THE INVENTION

Embodiments of the present invention relate to an apparatus for thermally isolating components in an imaging device comprising a mount for mounting the components; a clamp for holding the mount, and an accompanying first plate on the opposite side of the mount, for preventing rotation of the mount; particulate matter, positioned between the clamp and the mount, and the first plate and the mount, for absorbing heat generated by the components and isolating the mount thermally from the rest of the apparatus; and a second plate coupled to the first plate and a third plate coupled to the clamp, both coupled to a securing mechanism for compressing the apparatus and preventing breakage of the first plate and the clamp.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Embodiments of the present invention comprise a mechanically robust thermal isolation mechanism for components to absorb heat and avoid heat transfer to thermally-sensitive components in a probe head. Often the RF antenna of a probe head, as described in related U.S. patent application Ser. No. 13/361,056, hereby incorporated by reference in its entirety, generates heat and transfers this heat undesirably to electrical components or sensitive components such as an optical fiber or cantilever, skewing accuracy of measurements or causing dysfunction. As such, the RF antenna component must be kept thermally isolated from other parts of a probe head. Therefore, the thermal isolation apparatus discussed herein is a sub-component of the apparatus disclosed in U.S. patent application Ser. No. 13/361,223, which issued as U.S. Pat. No. 8,549,661, hereby incorporated by reference in its entirety, to prevent heat from the RF component mounting.

Figure 2:
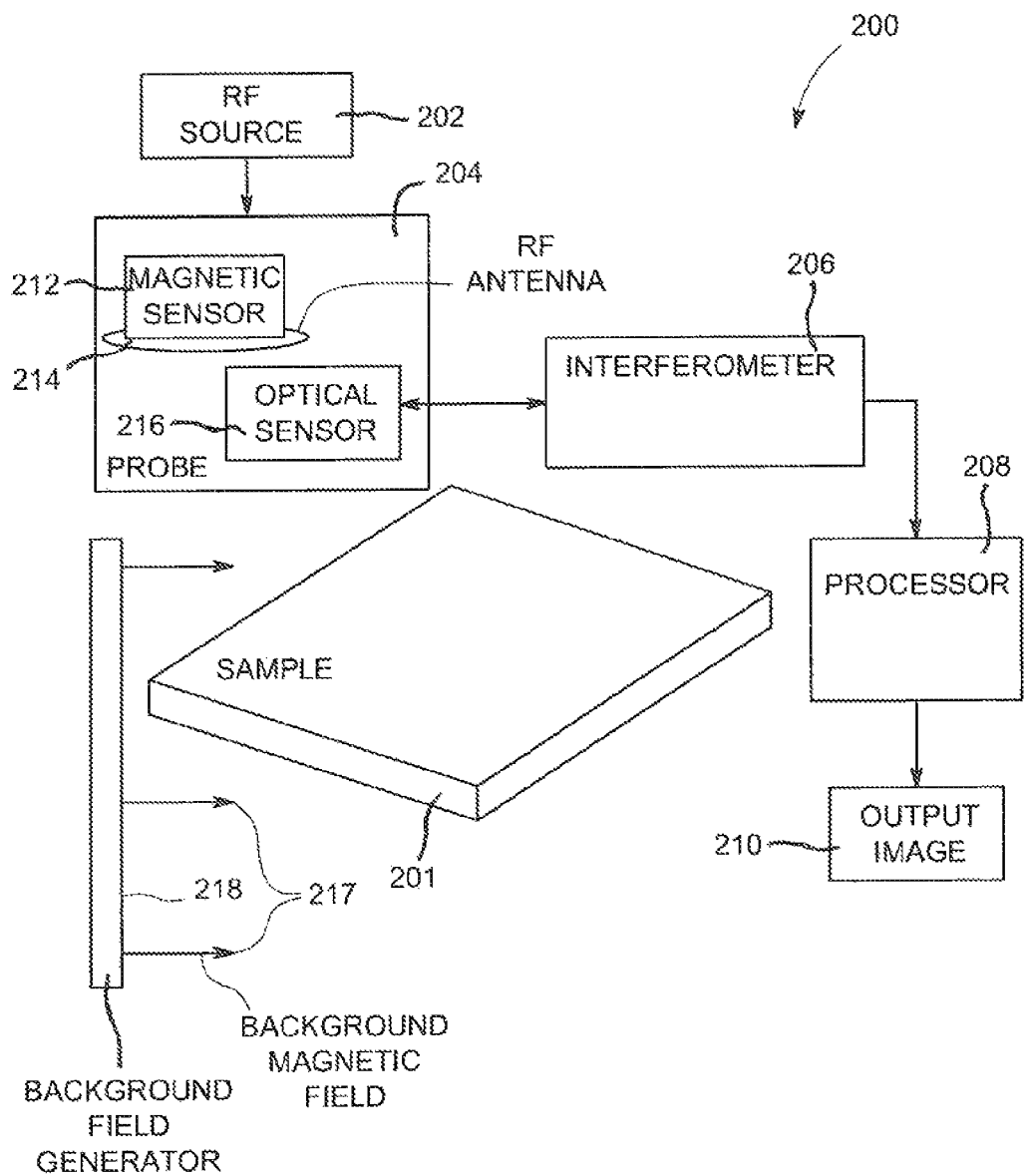
FIG. 2 depicts a block diagram of an MRFM system in accordance with an exemplary embodiment of the present invention.

FIG. 2 depicts a block diagram of an MRFM system 200 in accordance with an exemplary embodiment of the present invention. The system 200 generally has an RF source 202 coupled to a probe 204. The probe 204 is coupled to an interferometer 206 for performing optical measurements using the optical sensor 216 in the probe 204 of sample 201. The interferometer 206 transmits the measurements to a processor 208. The processor 208 generates an output image 210 based on the measurements or oscillations of portions of the probe 204. The probe 204 comprises a magnetic sensor 212, an RF antenna 214 and an optical sensor 216. The apparatus 200 is kept in a spatially homogeneous background magnetic field 217 (approximately 9 T) generated by a background magnetic field generator 218. In an exemplary embodiment, the background magnetic field generator 218 comprises two one inch diameter Samarium Cobalt (SmCo) magnets. In an exemplary embodiment, the magnetic sensor 212 is comprised of a bridge coupled with a smaller SmCo particle (for example, 10 μm in diameter) which generates a spatially inhomogeneous field. The magnetic field experienced at a particular point in the sample 201 is the sum of the background magnetic field and the magnetic field generated by the magnetic sensor 212. The RF antenna 214 at least partially circumscribes the magnetic sensor 212. The RF antenna 214 generates an RF magnetic field which causes the spin in the particles of the sample 201 to reverse and oppose the SmCo particle on the bridge of the magnetic sensor 212. This repeated reversal of the spin of the particles in sample 201 causes the magnetic sensor 212 to oscillate at a particular frequency. The interferometer 206 senses oscillation of the magnetic sensor 212 using optical sensor 216 by using optical fiber 216 to reflect a laser off of the magnetic sensor 212. In another exemplary embodiment, the sample 201 is directly coupled to the bridge comprising the magnetic sensor 212 and a magnetic particle array of SmCo particles is proximate the magnetic sensor 212. According to an exemplary embodiment, the optical fiber is 125 microns in diameter and is within approximately 1/10 of a millimeter of the magnetic sensor 212. In an exemplary embodiment, the optical sensor 216 is an optical fiber approximately twenty five times greater in diameter than the width of the bridge of the magnetic sensor 212. The gap between the optical fiber and the magnetic sensor 212 is fixed at a particular distance in this embodiment. Thermal isolation apparatus 300 isolates the heat generated by the RF antenna 214 from other probe components so accuracy of measurements is not skewed, or the signal to noise ratio is not significantly reduced due to Brownian motion in the magnetic sensor 212.

Figure 3:
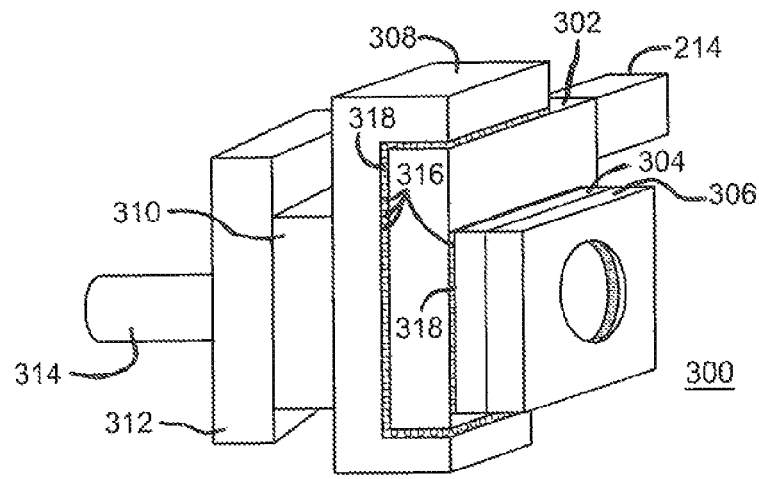
FIG. 3 is an illustration of a thermal isolation apparatus in accordance with exemplary embodiments of the present invention.

FIG. 3 is an illustration of a thermal isolation apparatus 300 in accordance with exemplary embodiments of the present invention. The apparatus 300 is one embodiment of isolation apparatus 215 of FIG. 2. The isolation apparatus 300 thermally isolates a component mount 302, using plates 304, 306, clamp 308 and plate 310, from mechanical mount 312. The isolated component mount 302 is made of a very hard surface material that small objects are not able to penetrate. In an exemplary embodiment, the component mount 302 is made of sapphire and RF antenna components 214 which generate heat are mounted on component mount 302. Plates 304 and 306 also have a hard surface material and are located on either side of isolated component mount 302. In an exemplary embodiment, plates 304 and 306 are made of Macor®, a machineable glass-ceramic with excellent thermal characteristics, acting as efficient insulation, and stable up to temperatures of 1000° C., with very little thermal expansion or outgassing.

Plates 306 and 310 are located adjacent to plates 304 and 306, coupled to their out-facing surfaces. In exemplary embodiments, plates 306 and 310 are made of more malleable material than plates 304 and 308, particularly metals such as copper and the like, that can better withstand mechanical compression caused by screw 314. The screw 314 passes through component mount 302 through a hole (not shown) that is larger than the diameter of screw 314, therefore the component mount 302 is thermally isolated from the screw 314. In another embodiment, the screw 314 is not a screw but another securing mechanism under tension to compress all the components together such as a wire pulled tight and attached to 306 and 312 under tension, a rod under tension attached to 306 and 312 via glue, welding, epoxy, swaging, soldering and other methods know to experts in the art. In an exemplary embodiment, mechanical mount 312 is made of titanium or any non-magnetic material and is responsible for positioning the RF antenna components mounted on component mount 302. In other embodiments, plates 306 and 310 are washers instead of plates. Though not shown in the figure, component mount 302, plate 304, clamp 308 and plate 310 have a large hole bored into them allowing the screw 314 to pass through these components without any contact with 302, 304, 308, and 310.

Particulate matter, or, dust, 316 is held by a securing substance 318, which in an exemplary embodiment, is comprised of wax. In exemplary embodiments, the dust 316 is composed of hard material such as sapphire pieces, ceramics, glass, semiconductors or other hard and poor thermal conductivity material. In this exemplary embodiment, the dust 316 is 75 μm diameter glass spheres. The dust 316 covers the surface of plate 304, clamp 308 and component mount 302 well enough so even when the components are compressed together, the surfaces of component 304 and 302, and 308 and 302 do not come into direct contact with each other. The dust 316 enclosed in a securing material 318 is sandwiched between the two elements 308 and 302, therefore there is no surface contact between element 308 and 302. This is also true for the upper portion of the clamp 308, where the top lip of clamp 308 touches the component mount 302. A layer of dust 316 is suspended by securing substance 318 for eliminating the surface area contact between the lip of clamp 308 and component mount 302 at the top and bottom of clamp 308, though not shown in the Figure.

By prohibiting the large flat surfaces of plates 304, 302 and 308 from coming into direct contact with each other, heat generated by component mount 302 can only be conducted to plates 304 and 306 through the dust 316, as disclosed in a paper entitled "Thermal Impedance of pressed contacts at temperatures below 4° K" by Yoo and Andersen, hereby incorporated by reference. Since the dust 316 and its mating surfaces are all hard materials, under compression, deformation of the plates and components is minimized and the contact area between the two remains miniscule. Reduction of the contact area between two objects directly results in lesser thermal conductivity between the two. It is necessary to provide a mechanism to remove the heat generated in the components mounted on the component mount 302 or the component mount 302 will rapidly overheat. Heat generated in the components mounted on the component mount 302 is removed from 302 by conduction through a thermal link with one end attached to 302 and the other end attached to a heat sink in the system. To help mechanically stabilize the apparatus 300 from rotation with respect to mechanical mount 312, plate 310 is attached to clamp 308 using a securing material such as glue or epoxy. Similarly, plates 304, 306 and 314 are optionally attached to each other with glue, epoxy or other securing material.

In this exemplary embodiment clamp 308 is in a C shape for holding component mount 302 from rotating around the axis created by the screw 314, along with plate 304. In other embodiments, other shapes for the clamp 308 are possible as long as component mount 302 is not allowed to rotate around the axis defined by 314 or translate in the plane defined by the dust 316. According to another exemplary embodiment, the clamp 308 has a pronged portion at the top and the bottom so that the securing material only need be placed at the contact points between clamp 308 and component mount 302. As disclosed in related U.S. patent application Ser. No. 13/361, 223 a cantilever is also an important part of an MRFM imaging apparatus probe head along with the RF antenna. The component mount 302 upon which the RF antenna 214 is mounted must not rotate relative to the cantilever of the probe head 204, otherwise the RF magnetic field from the RF antenna 214 will be distorted and measurements of structure of the sample 201 will be inaccurate. In this exemplary embodiment, one translational and two rotational degrees of freedom for component mount 302 are very well constrained by the compression of materials by screw 314, while one translational degree of freedom is constrained by the friction between the components of the apparatus 300. In this exemplary embodiment, one rotational and one translational degree of freedom for component mount 302 are very well constrained by the top and bottom of the clamp 308. In other exemplary embodiments, the number of translational and rotational degrees of freedom that component mount 302 possesses must be constrained depending on the application and the direction of the applied torque and forces on the apparatus 300.

Figure 1:
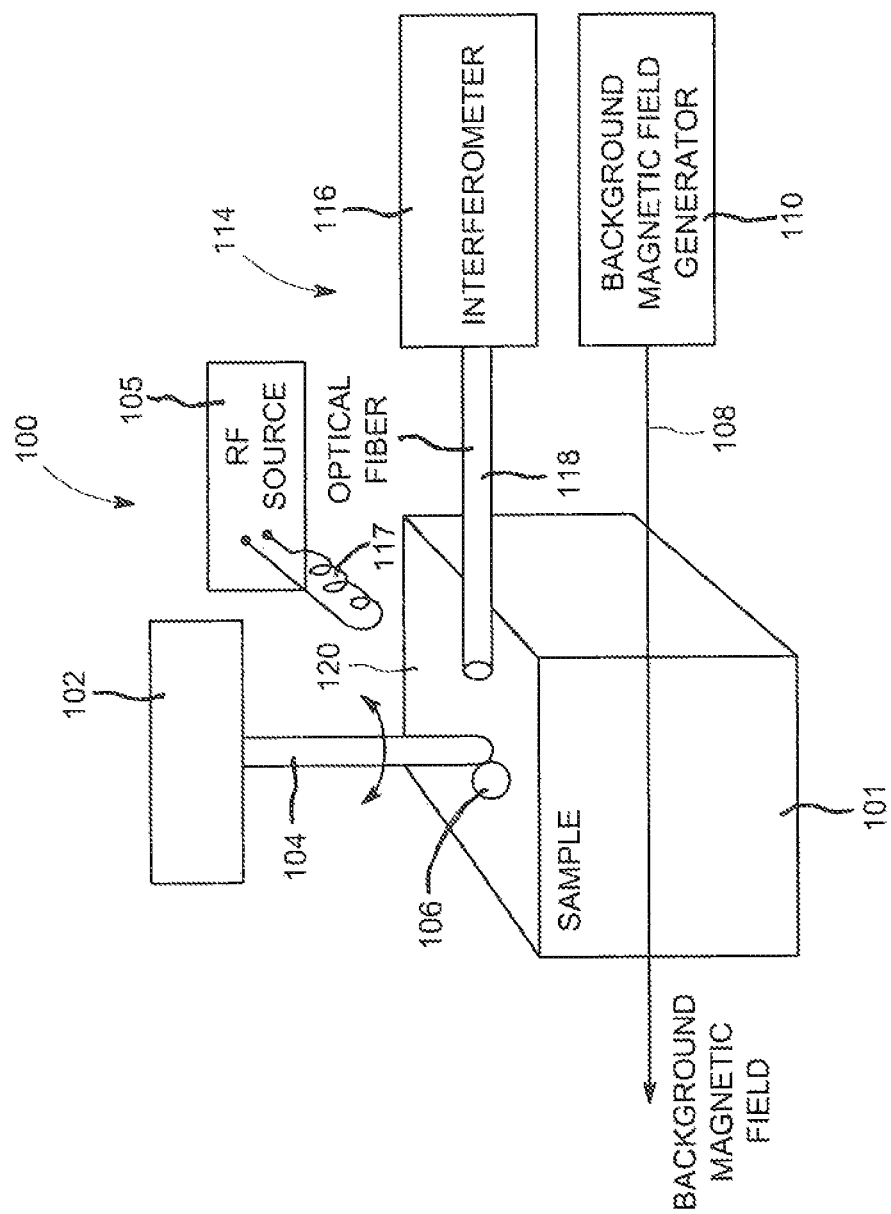
FIG. 1 depicts a conventional MRFM system known to those of ordinary skill in the art.
Figure 4:
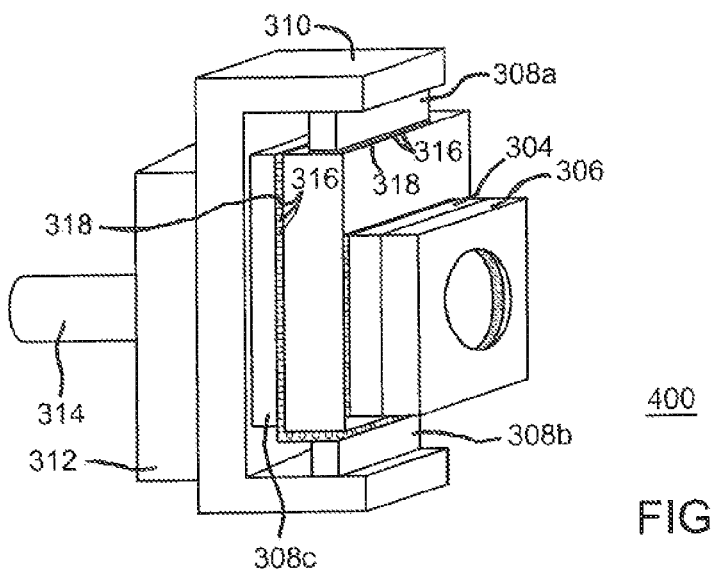
FIG. 4 is an illustration of another configuration of a thermal isolation apparatus in accordance with exemplary embodiments of the present invention.

FIG. 4 is an illustration of another configuration of a thermal isolation apparatus 200 in accordance with exemplary embodiments of the present invention. FIG. 4 is largely similar to FIG. 1, with the exception that in this embodiment, plate 310 is formed into a C clamp as opposed to clamp 308 in FIG. 1. In this embodiment, clamp 308 is separated into bars 308a, 308b and plate 308c. The machining of plates 308a, 308b, and 308c is easy and the design is more robust as clamp 310 is made of metal instead of a brittle material. Therefore clamp 310 is physically stronger and able to withstand more stress and compression caused by screw 314 and the component mount 302. In this embodiment, 308a, 308b and 308c are under compressive forces and not sheer forces as in FIG. 1. Plates 308a, 308b and 308c are coated with securing material 318 within which dust 316 is suspended, to minimize contact between the plates and the component mount 302. If the component mount 302 is not a hard surfaced material, a securing material such as glue or epoxy is used to attach a hard material to the component mount 302 to stabilize it for better grip and to prevent the dust 316 from penetrating the surface of component mount 302. This apparatus 400, as compared to previous embodiments, is heavier but more robust.

In other exemplary embodiments, apparatus 300 and 400 both contain thermal guard rings to capture any residual heat that does leak out of the compressed component plates. In an exemplary embodiment, plates 306 and mechanical mount 312 are made of a good thermal conductor such as copper and via the same or separate connections, are thermally grounded to an appropriate cold point (heatsink) in the system. In this configuration, any heat absorbed into the screw 314 and through screw 314 into mechanical mount 312 is dissipated into the thermal ground before being absorbed by the other components of the apparatuses 300 or 400. Thermally grounding plate 306 causes the heat from the compressed plates to be removed before the heat might be transferred to screw 314, reducing the overall temperature for some components in apparatuses 300 and 400.

Figure 5:
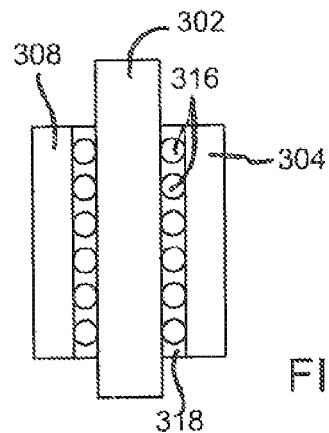
FIG. 5 is an end-view of the thermal isolating apparatus in accordance with exemplary embodiments of the present invention.

FIG. 5 is an end-view of thermal isolating apparatus 300 in accordance with exemplary embodiments of the present invention. Dust 316 is shown secured by a securing material 318 such as wax between components 302 and plates 304 and 308. As discussed above, the dust 316 reduces the contact surface area between the component mount 302 and the plates 304 and 308 and therefore reducing the heat transferred from components 302 to plates 308 and 304.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

Various elements, devices, modules and circuits are described above in associated with their respective functions. These elements, devices, modules and circuits are considered means for performing their respective functions as described herein. While the foregoing is directed to embodiments of the present invention, other and further embodiments of the invention may be devised without departing from the basic scope thereof, and the scope thereof is determined by the claims that follow.

The invention claimed is:

1. A probe for scanning a surface of an arbitrarily sized sample in magnetic resonance force microscopy comprising:
    a magnetic sensor having a support element coupled to a magnetic particle;
    an RF antenna, at least partially circumscribing the magnetic sensor, for emitting an RF magnetic field across a portion of the sample, mounted on a thermal isolation apparatus; and
    an optical sensor, positioned proximate the magnetic sensor, for detecting displacement of the support element,
    wherein the thermal isolation apparatus comprises:
    a sapphire mount for mounting the components;
    a clamp for holding the mount, and an accompanying first plate on the opposite side of the mount, for preventing rotation of the mount;
    glass beads, positioned between the clamp and the mount, and the first plate and held in place by securing material, and the mount, for absorbing heat generated by the components and isolating the mount thermally from the rest of the apparatus; and
    a second plate coupled to the first plate and a third plate coupled to the clamp, both coupled to a securing mechanism for compressing the apparatus and preventing breakage of the first plate and the clamp, and a mechanical mount coupled to the third plate for positioning the components.

2. The probe of claim 1 wherein the securing mechanism is a screw.

3. The probe of claim 1 wherein at least one of the mechanical mount and the second plate are thermally grounded to a heatsink.

4. The probe of claim 1 wherein the clamp, the mount and the first plate are made of a sufficiently hard material for preventing the glass beads from penetrating their surface.

5. The probe of claim 1, wherein the securing material holding the glass beads is wax.

6. The probe of claim 1, wherein the glass beads are 75 μm in diameter.

7. The probe of claim 1, wherein the glass beads are suspended in the securing material.

8. The probe of claim 1, wherein the glass beads and securing material are sandwiched between the clamp and the mount.

9. The probe of claim 1, wherein the entire surfaces of the clamp and mount in contact with one another are covered with the glass beads and securing material.

10. The probe of claim 1, wherein the glass beads comprise sapphire, ceramics, glass, or a semiconductor material, which has a high hardness and poor thermal conductivity.

\* \* \* \* \*